United States Patent [19]

Garbassi et al.

[11] Patent Number: 4,826,755
[45] Date of Patent: May 2, 1989

[54] PROCESS OF PHOTOETCHING OF SUPERFICIAL COATINGS BASED ON POLYMERIC MATERIALS

[75] Inventors: Fabio Garbassi; Ernesto Occhiello, both of Novara; Vincenzo Malatesta, Cologno Monzese, all of Italy

[73] Assignee: Montedison S.p.A., Milan, Italy

[21] Appl. No.: 67,150

[22] Filed: Jun. 29, 1987

[30] Foreign Application Priority Data

Jul. 3, 1986 [IT] Italy ................ 21019 A/86

[51] Int. Cl.$^4$ ............ G03C 5/16; B23K 9/00
[52] U.S. Cl. ..................... 430/322; 430/945; 430/269; 430/270; 430/494; 219/121.67; 219/121.68; 522/2; 156/643
[58] Field of Search ......... 430/945, 269, 270, 494, 430/322; 219/121 LH, 121 LJ, 121.67, 121.68, 121.69; 156/643; 522/2

[56] References Cited

U.S. PATENT DOCUMENTS 4,414,059 11/1983 Blum et al. .................. 430/945

OTHER PUBLICATIONS

Chemical Abstracts, vol. 103, No. 4, Jul. 29, 1985, Columbus Ohio, USA, Garmonov, V.I. "Preparation and Study of Some Properties of Poly(p-xylxlene) Films", Abstract No. 23236r.

Primary Examiner—Paul R. Michl
Assistant Examiner—Cynthia Hamilton
Attorney, Agent, or Firm—Stevens, Davis, Miller & Mosher

[57] ABSTRACT

Process of photoetching of superficial coatings based on polymeric material comprising the irradiation of the coated surface with localized excimer laser beams having wavelengths equal to or lower than 193 nm.

4 Claims, No Drawings

PROCESS OF PHOTOETCHING OF SUPERFICIAL COATINGS BASED ON POLYMERIC MATERIALS

DESCRIPTION OF THE INVENTION

The present invention relates to a process of photoetching of superficial coatings based on polymeric materials.

More particularly, this invention relates to a process of photoetching of films based on poly-p-xylylenes by excimer laser irradiation.

Processes for eliminating polymeric coatings from coated surfaces such as, for example, processes based on treatments of a mechanical type (sandblasting, scraping, etc.), thermal type (flame), and chemical type (washings and baths with corrosive liquids), are known in the art.

A drawback of those processes is that they find a good application only when the surfaces to be treated are wide and particularly when it is not necessary to work with predetermined degrees of accuracy as required in some applications in the electronic field. For example, in the printed circuit field the support plates are coated with insulating films, mainly based on poly-p-xylylenes, with the exception of small well defined areas wherein the electronic contacts must be provided.

A very widely used system for avoiding the polymeric coating elimination process is that known as "masking". According to this system, the areas to be uncovered are protected, before the coating phase, by suitable protective means. When the coating process is ended, the protective means are eliminated and the end product is then ready for the intended use. However, the "masking" system also presents some drawbacks: for example, it is laborious and expensive, and it can contaminate the support, if adhesive substances are used.

As an alternative to the masking system, systems comprising the use of infrared laser beams have been proposed. These systems also present some drawbacks because they allow one to obtain, by the photoetching, uncovered microareas, but with geometries not well defined.

It has now been discovered, according to the present invention, that the above-mentioned drawbacks are eliminated by a process for the photoetching of superficial coatings of polymeric materials comprising the irradiation of the coated surface with localized excimer laser beams having wavelengths equal to or lower than 193 nm. Localized excimer laser beams having wavelengths of 154 nm or 193 nm are preferred.

According to the present invention, it is possible to obtain, on a surface completely coated with a thin layer of polymeric material, microareas also less than one square micron and with geometries of the photoetched parts well defined spatially.

The process of the present invention may be applied on superficial polymeric coatings of every type, although superficial coatings based on poly-p-xylylenes and its chlorinated derivatives, such as poly-2-chloro-p-xylylenes, are preferred.

The thickness of the film to be photoetched is not critical for the present process; however, films of thickness less than 100 micrometers are preferred.

Any excimer laser apparatus may be used for the photoetching of superficial coatings based on polymeric materials, with the proviso that the emitted beams have a wavelength equal to or lower than 193 nm. For example, the excimer laser apparatus produced by Lambda Physik, Model EMG 102, that emits at wavelengths of 154 nm, 193 nm, 248 nm, 337 nm, 351 nm.

The impulse time of the localized excimer laser beams utilized for the photoetching process of the present invention is generally lower than 100 ns and the frequency is from 1 to 100 Hz.

The power for each impulse is lower than 100 mW, the peak power being lower than 10 mW.

The operating procedures for the process of the present invention are those per se known in the use of laser beam instruments.

It is possible to work in a normal atmospheric environment such as in an environment having a controlled atmosphere or under vacuum and positioning the sample in the focal plane of a lens that has the function of concentrating and focusing the laser beam.

Other optical systems that can be used for the process of the present invention are mirrors and beam splitters, with the purpose opf deviating and/or dividing the laser beam into many secondary beams and, optionally, of directing them to different points of the sample, diaphragms for the geometry of the zone to be photoetched, etc.

For a still better understanding of the present invention and of putting it into practice, some illustrative, but not limitative, examples are now given.

EXAMPLE 1

A polymeric film of poly-2-chloro-p-xylylene having a thickness of 6 micrometers, and supported on a glass sheet having a surface of 10 cm$^2$, was subjected to photoetching for removing the coating from an area of 1.5 mm$^2$.

An excimer laser instrument produced by Lambda Physik, Model EMG 102, was used. The laser beam, having a wavelength of 193 nm, was emitted with an impulse time of 10 ns, the power for each impulse was equal to 12 mW, the peak power was 1 mW, the flux, determined as the quantity of irradiated energy for each superficial unit, was 0.8 J/cm$^2$.

The material underwent photoetching at a rate between 0.3 and 0.5 micrometers/impulse.

Through optical and electronic microscopy and X-rays photoemission spectroscopy, the complete elimination of polymeric film from the area under examination resulted, without an substantial alteration of the zones surrounding the photoetched zone.

EXAMPLE 2

A polymeric film of poly-2-chloro-p-xylylene having a thickness of 15 micrometers, and supported on a steel plate having a surface of 10 cm$^2$, was subjected to photoetching for removing the coating from an area of 1.5 mm$^2$.

An excimer laser instrument produced by Lambda Physik, Model EMG 102, was used. The laser beam, having a wavelength of 193 nm, was emitted with an impulse time of 30 ns, the power for each impulse being equal to 59 mW, the peak power being 5 mW, and the flux 4 J/cm$^2$.

The material underwent photoetching at a rate between 0.3 and 0.5 micrometers/impulse.

Through optical and electronic microscopy and X-rays photoemission spectroscopy, the complete elimination of polymeric film from the area under examination, without any substantial alteration of the zones surrounding the photoetched zone, was effected.

What is claimed is:

1. A process for the photoetching of superficial coatings of a polymeric material constituted by poly-p-xylylene or chlorinated derivatives thereof, said process comprising the irradiation of the coated surface with a localized excimer laser beam having a wavelength equal to or lower than 193 nm.

2. A process for the photoetching according to claim 1, wherein the localized excimer laser beam has a wavelength of 154 to 193 nm.

3. A process for photoetching according to claim 1, wherein the superficial coating is constituted by poly-2-chloro-p-xylylene.

4. A process for photoetching according to claim 2, wherein the superficial coating is constituted by poly-2-chloro-p-xylylene.

* * * * *